(12) United States Patent
Athas

(10) Patent No.: US 7,782,149 B1
(45) Date of Patent: Aug. 24, 2010

(54) ENERGY EFFICIENT WAVEFORM GENERATION USING TUNED RESONATORS

(76) Inventor: William C. Athas, P.O. Box 8775, San Jose, CA (US) 95155

( * ) Notice: Subject to any disclaimer, the term of this patent is extended or adjusted under 35 U.S.C. 154(b) by 45 days.

(21) Appl. No.: 12/355,971

(22) Filed: Jan. 19, 2009

Related U.S. Application Data

(63) Continuation of application No. 11/419,922, filed on May 23, 2006, now Pat. No. 7,479,838.

(60) Provisional application No. 60/684,457, filed on May 25, 2005.

(51) Int. Cl.
*H03B 11/04* (2006.01)
*H03B 11/10* (2006.01)
(52) U.S. Cl. ...................... 331/165; 331/166
(58) Field of Classification Search ............. 331/117 R, 331/117 FE, 117 D, 165, 166
See application file for complete search history.

(56) References Cited

U.S. PATENT DOCUMENTS

| | | |
|---|---|---|
| 3,761,833 A | 9/1973 | Mader |
| 3,919,656 A | 11/1975 | Sokal |
| 5,107,136 A | 4/1992 | Stekelenburg |
| 5,506,520 A | 4/1996 | Frank |
| 5,508,639 A | 4/1996 | Fattaruso |
| 5,559,463 A | 9/1996 | Denker |
| 5,559,478 A | 9/1996 | Athas |
| 5,734,285 A | 3/1998 | Harvey |
| 5,838,203 A | 11/1998 | Stamoulis |
| 6,864,755 B2 | 3/2005 | Moore |
| 7,005,935 B2 * | 2/2006 | Moore .................. 331/166 |
| 2004/0130362 A1 | 7/2004 | Athas |
| 2005/0286278 A1 | 12/2005 | Perreault |

OTHER PUBLICATIONS

Glasoe, G. and Lebacqz, L., editors, "Pulse Generators," Massachusetts Institute of Technology Radiaion Laboratory Series, First Edition, McGraw-Hill Book Company, New York, 1948, Section 6-3, pp. 189-207.

Gardner, F., "Phase Accuracy of Charge Pump PLLs," IEEE Transactions on Communications, vol. COM-30, No. 10, Oct. 1982, pp. 2362-2363.

Seitz, C., Frey, A., Mattisson, S., Rabin, S., Speck, D. and van de Snepscheut, J., "Hot-Clock nMOS," Proceedings of the 1985 Chapel Hill Conference on VLSI, 1985, pp. 1-17.

Maksimovic, D., "A MOS Gate Drive With Resonant Transitions," Proceedings of IEEE Power Electronics Specialists Conference (PESC), 1991, pp. 527-532.

(Continued)

*Primary Examiner*—David Mis
(74) *Attorney, Agent, or Firm*—Stephen W. Melvin

(57) ABSTRACT

A power source, a primary inductor, a load capacitance, and one or more tuned branch resonators and switching devices are coupled to generate pulses which represent a superposition of sinusoidal waveforms. The primary inductor is connected between the power source and the load. At the start of each cycle the load is coupled to ground and each tuned-branch resonators is reinitialized to re-energize the circuits and to stabilize the waveform when the frequencies of the sinusoidal waveforms are non-periodic.

14 Claims, 12 Drawing Sheets

OTHER PUBLICATIONS

Weinberg, S., "A Novel Lossless Resonant MOSFET Driver," Proceedings of IEEE Power Electronics Specialists Conference (PESC), 1992, pp. 1003-1010.

Maksimovic, D. and Oklobdzija, V., "Integrated Power Clock Generators for Low Energy Logic," Proceedings of IEEE Power Electronics Specialists Conference (PESC), Jun. 1995, pp. 61-67.

Younis, S. and Knight, T., "Non-Dissipative Rail Drivers for Adiabatic Circuits," Proceedings of the Sixteenth Conference on Advanced Research in VLSI 1995, Los Alamitos, CA, pp. 404-414.

Athas, W., Svensson, L. and Tzartzanis, N. "A Resonant Signal Driver for Two-Phase, Almost-Non-Overlapping Clocks," Proceedings of 1996 International Symposium on Circuits and Systems, Atlanta, GA, May 12-15, 1996, pp. 129-132.

Athas, W., Tzartzanis, N., Mao. W., Peterson, L, Lal, R., Chong, K., Moon, J-S., Svensson, L. and Bolotski, M., "The Design and Implementation of a Low-Power Clock-Powered Microprocessor," IEEE Journal of Solid-State Circuits, vol. 35, No. 11, Nov. 2000, pp. 1561-1570.

Athas, W., "Practical Considerations of Clock-Powered Logic," Proceedings of 2000 international Symposium on Low Power Electronics and Design (ISLPED), Rapallo, Italy, 2000, pp. 173-178.

Moon, J-S, Athas, W., Soli, S., Draper, J. and Beerel, P., "Voltage-Pulse Driven Harmonic Resonant Rail Drivers for Low-Power Applications," IEEE Transactions on Very Large Scale Integration (VLSI) Systems, vol. 11, No. 5, Oct. 2003, pp. 762-777.

* cited by examiner

ENERGY EFFICIENT WAVEFORM GENERATION USING TUNED RESONATORS

CROSS-REFERENCE TO RELATED APPLICATIONS

This application is a continuation of U.S. patent application Ser. No. 11/419,922, filed on May 23, 2006, now U.S. Pat. No. 7,479,838, issued on Jan. 20, 2009, and claims priority to provisional application 60/684,457, filed May 25, 2005, each of which is incorporated herein by reference.

FIELD OF THE INVENTION

The present invention relates to systems for generating waveforms representing the superposition of two or more sinusoidal waveforms, and more particularly to systems for generating waveforms for driving loads that have significant capacitive reactance.

BACKGROUND

It is known in the art how to generate sinusoidal signals using inductors and capacitors as the resonant elements. FIG. 1 shows the sinusoidal signal that results from the LC tank circuit of FIG. 2. In FIG. 2, inductor 210 (L) is connected in parallel with capacitor 220 (C) and the output voltage 250 ($V_{out}$) is measured across the two components. Although such sinusoidal signals can be generated with high efficiency, i.e., minimal power loss, these signals have many limitations when used for digital and analog applications. In the case of digital logic, there is no well defined "high" or "logical one" voltage level and likewise for the "low" or "logical zero" voltage level. Furthermore, the slow rise and fall times of the sinusoidal signal increases the response time of the interfacing circuits and is an additional source of power dissipation in the interfacing circuits.

These limitations of a sinusoidal signal are partially overcome by replacing the lower portion of the sine wave with a substantially flat section, as illustrated in FIG. 3. Such a technique is described in U.S. Pat. No. 5,559,478 and in the article by W. Athas, et al., entitled "A Resonant Signal Driver for Two-Phase, Almost Non-Overlapping Clocks," published in the *Proceedings of the* 1996 *International Symposium on Circuits and Systems,* 1996. The occurrence of a sinusoidal pulse defines the high or logical one level and the absence the low or logical zero level, or vice versa.

However, the waveform of FIG. 3 is not suitable for many applications because it is highly desirable that the binary values be defined as levels with short transition times between the levels. The desired waveform is the trapezoidal signal of FIG. 4 in which the top and bottom are flat, and the rise and fall times are fast while minimizing power dissipation. Unfortunately, by conventional means the power required to generate the waveform of FIG. 4 for a capacitive signal load is at least twice the signal power. It is therefore desirable to generate a waveform similar to that shown in FIG. 4 while minimizing the power requirements.

Note that for the application domain of power electronics, it is often desirable to use a power MOSFET as a switch to control a large current. The power dissipation due to the on-resistance of the power MOSFET equals the square of the current times the on-resistance of the MOSFET, as illustrated below:

$$P_{on} = I^2 R_{on} \quad (1)$$

The larger the gate area of the MOSFET, the lower the value of the on-resistance. However, the input gate capacitance increases with the size of the MOSFET. If the input gate is driven from a non-resonant circuit, the power dissipation of the gate is at least:

$$P_{gate} = F C_{gate} V^2 \quad (2)$$

where F is the frequency at which the gate is pulsed and V is the voltage potential between the gate and ground. To a first approximation the on-resistance ($R_{on}$) and gate capacitance ($C_{gate}$) are inversely proportional. Total power is minimized when the power required to drive the gate equals the power dissipation due to the on-resistance of the power MOSFET.

Another source of power dissipation is the interval during which the gate voltage swings between its minimum value and maximum value. During such intervals the on-resistance must change from a very high resistance (on the order of megaohms) to a very small resistance (on the order of milliohms). The power dissipation during these intervals depends on the time duration of the interval and the shape of the waveform during the interval. Resonant circuits for powering the gate will dissipate less energy than a non-resonant circuit, but the long duration of the transitions will introduce larger power dissipation in the on-resistance of the power MOSFET.

Thus, there continues to be a very substantial need for waveform generating systems driving loads having significant capacitive reactance which have voltage transitions that are substantially shorter in time duration than the sinusoidal waveform, which have substantially flat top and bottom sections, and which minimize power dissipation below the conventional $FCV^2$ limits.

BRIEF SUMMARY OF THE INVENTION

The present invention addresses the shortcomings described above by providing a power source, a primary inductor, a load capacitance, and one or more tuned branch resonators and switching devices coupled to generate pulses that are a superposition of sinusoidal waveforms. The primary inductor is connected between the power source and the load. At the start of each cycle the load is coupled to ground and each tuned-branch resonators is reinitialized to re-energize the circuits and to stabilize the waveform when the frequencies of the sinusoidal waveforms are non-periodic.

DETAILED DESCRIPTION

Figure 4:
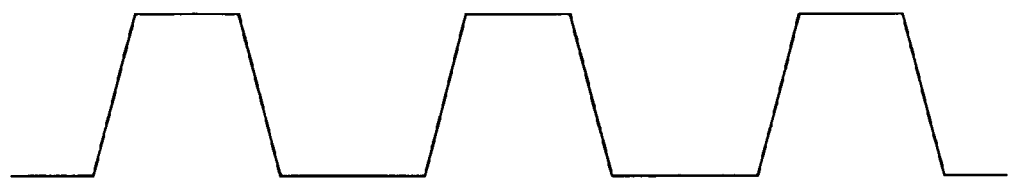
FIG. 4 illustrates a trapezoidal waveform that approximates a square wave which can be used in digital electronics for representing the logic levels of zero and one.

FIG. 4 illustrates an idealized waveform desirable for use in digital electronics.

Figure 5:
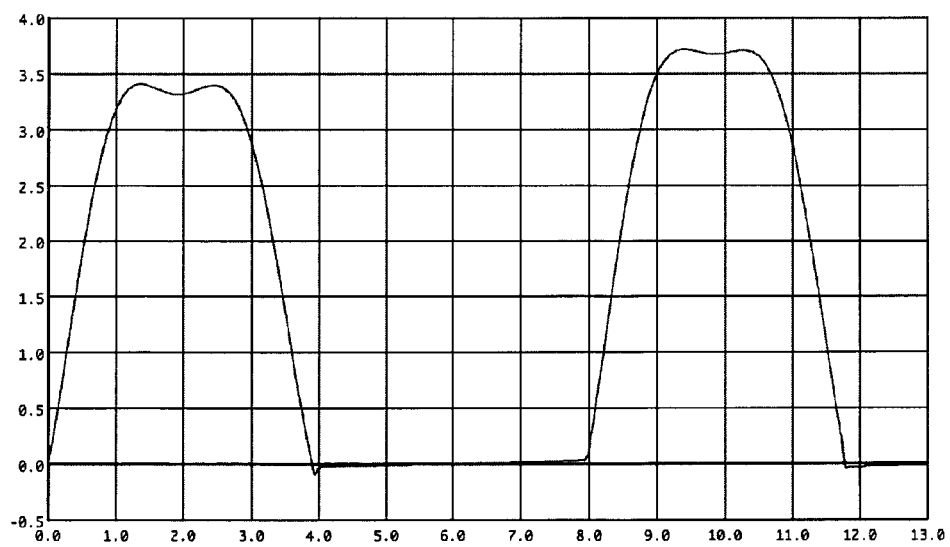
FIG. 5 illustrates a waveform that is generated from one embodiment of the invention showing substantially trapezoidal waveform for half of the time period and substantially flat for the other half of the time period.

The waveform of FIG. 5 is an example of an actual waveform approximating this ideal that can be generated from an embodiment of the present invention. As is illustrated below, the waveform of FIG. 5 can be generated with high efficiency.

Figure 6:
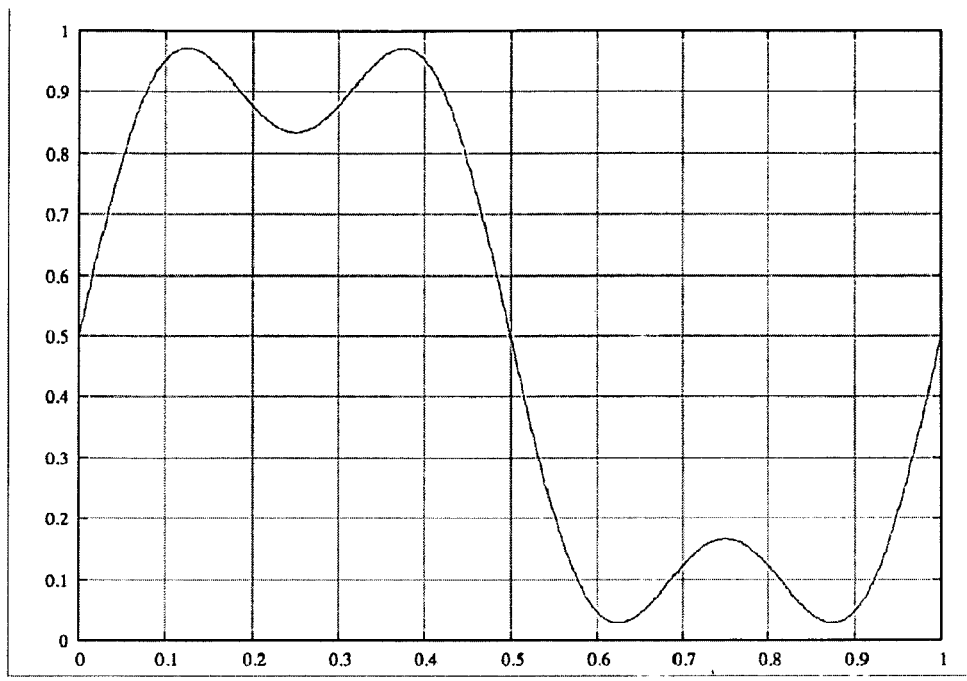
FIG. 6 illustrates a waveform generated from summing the fundamental plus third harmonic of the Fourier series for the square wave.

The present invention can be understood by first noting that Fourier series analysis dictates that any arbitrary periodic waveform can be generated by a superposition of sine waves of different integer-multiple frequencies and amplitudes. For example, a perfect square wave can be generated by the superposition of a sine wave at the fundamental frequency and an infinite series of sine waves at frequencies in odd multiples of the fundamental frequency and with amplitudes equal to the reciprocal of the frequency of each sine wave. Since such an infinite series is a combination of sine waves with decreasing amplitudes, using only the first few terms of this series will approximate a square save. For example, the waveform of FIG. 6 is the sum of the first two sine waves of the square wave approximation: a fundamental and a third harmonic at one-third the amplitude of the fundamental.

The objective of the invention is to develop voltage waveforms across the capacitive load ($C_0$) at frequency F that can be mathematically described as a superposition of sine waves:

$$V(t) = \sin \omega t + b_1 \sin m_1 \omega t + \ldots + b_n \sin m_n \omega t \quad (3)$$

Figure 7:
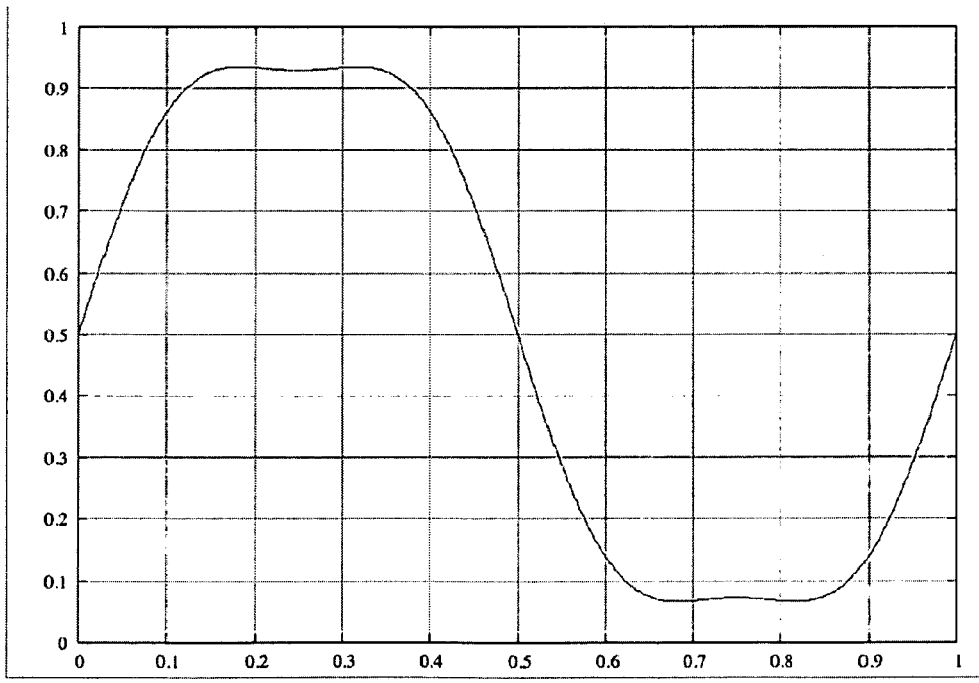
FIG. 7 illustrates a waveform generated from summing the fundamental plus third harmonic with the third harmonic attenuated by 8.45 dB.

The input frequency ($\omega$) is expressed in radians per second. To simplify the mathematics the voltage and currents are expressed in a form normalized to a reference voltage magnitude that can then be scaled to any voltage swing. The relative amplitudes of the sine waves and their frequency multipliers determine the rise and fall times (edge rates) and the degree to which there is ripple in the top and bottom portions of the waveform (smoothness). For the case of periodic waveforms the frequency multipliers are harmonically related as the odd whole numbers (1, 3, 5, 7, etc.). The book *Pulse Generators*, edited by Glasoe and Lebacz and published in 1948, contains mathematical formulae for tailoring the edge rates and smoothness through choice of amplitude multipliers. For example, FIG. 7 depicts the waveform of the fundamental plus one-seventh of the third harmonic. This waveform has slower edge rates but is significantly smoother than the waveform of FIG. 6.

Figure 1:
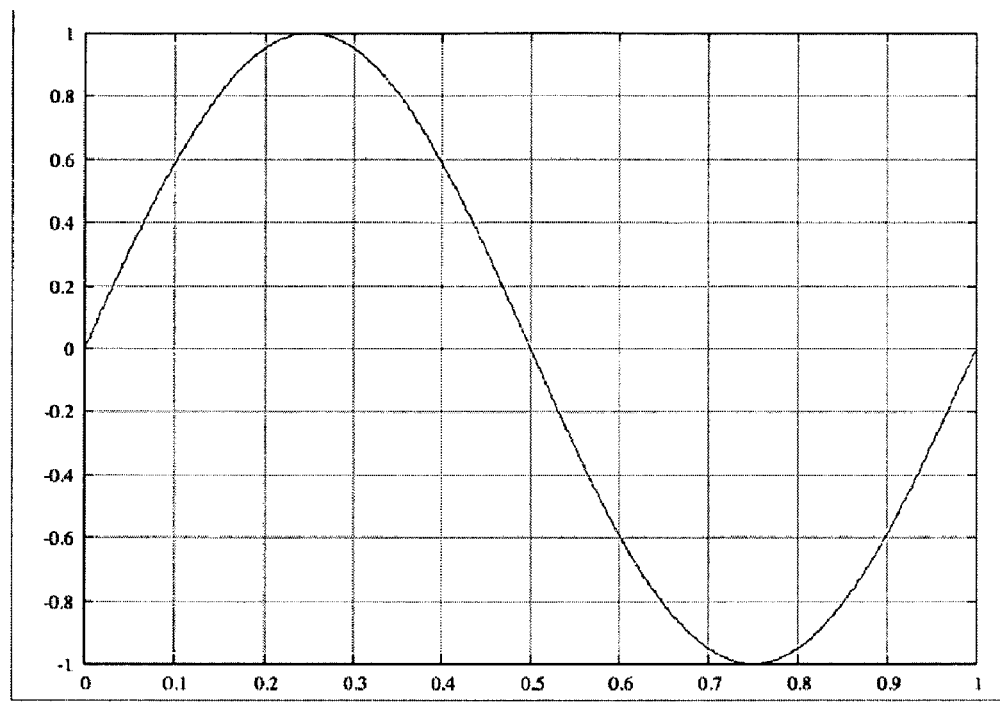
FIG. 1 illustrates a sinusoidal waveform that develops across the capacitor in an LC-tank circuit.
Figure 2:
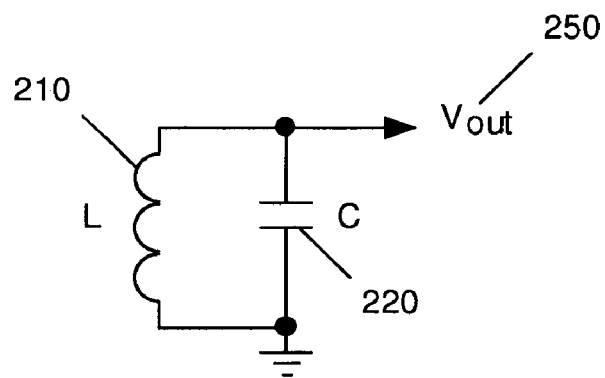
FIG. 2 is a diagram of an LC-tank circuit.
Figure 3:
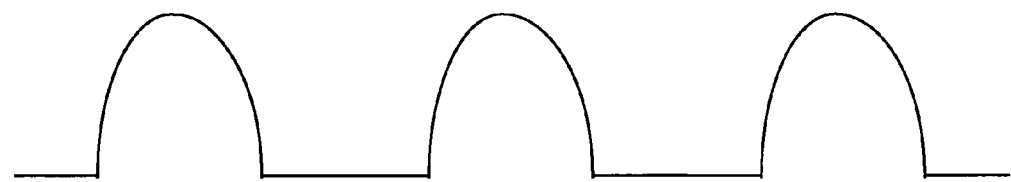
FIG. 3 illustrates a waveform generated with prior art showing half of the time period as a substantially sinusoidal waveform and the other half of the time period as a substantially flat waveform.
Figure 8:
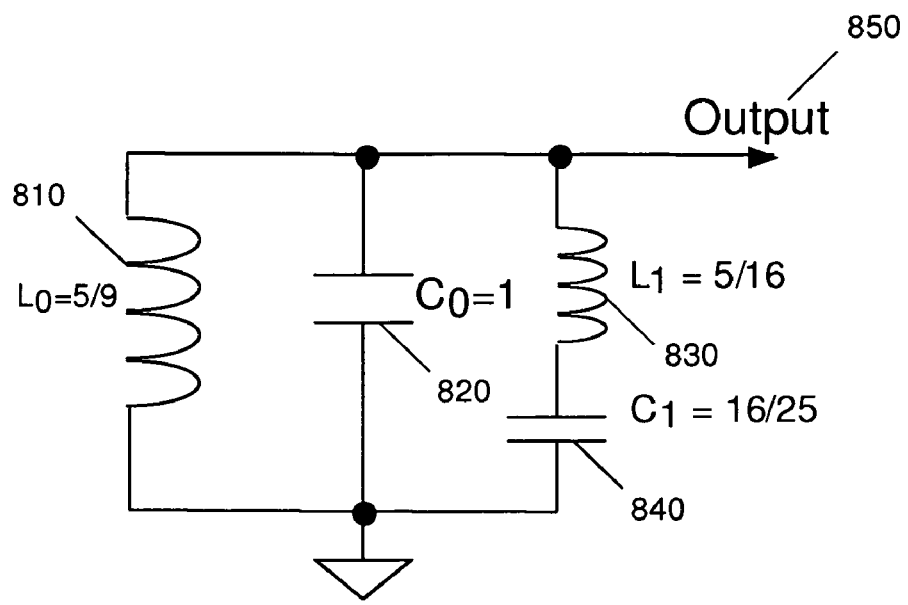
FIG. 8 illustrates a prior art circuit having a single branch resonator with the component values selected for a Fourier-series square wave.

The superposition of sine waves, such as illustrated in FIGS. 6 and 7 can be accomplished by adding a second pair of L and C components in parallel with the tank circuit of FIG. 2. This pair of L and C components is known as a branch resonator. In particular, the tank circuit of FIG. 2 is said to resonate at the fundamental frequency. It is possible to add a branch resonator so that the circuit will oscillate at the fundamental and third harmonic with the appropriate amplitude relationship between the fundamental and third harmonic. Such a circuit is illustrated in FIG. 8. Primary inductor 810 ($L_0$) and capacitor 820 ($C_0$) are connected in parallel. Connected in parallel with these components is the series combination of inductor 830 ($L_1$) and capacitor 840 ($C_1$). Output 850 is measured across capacitor 820 ($C_0$).

Note that a third pair of L and C components could be added to the circuit of FIG. 8 so that the overall system would oscillate at the fundamental, third and fifth harmonics. This process can be repeated indefinitely for the higher order harmonics. The process of adjusting branch resonators to achieve the superposition of multiple harmonics is described in the *Pulse Generators* book as well as in a paper by Moon et al. entitled "Voltage-Pulse Drive Harmonic Resonant Rail Drivers for Low-Power Applications," published in the *IEEE Transactions on Very Large Scale Integration (VLSI) Systems*, October, 2003.

In order to understand how the component values for the branch resonators are chosen, note that the normalized voltage equation above can be written in the frequency domain as:

$$V(s) = \omega \left( \frac{1}{s^2 + \omega^2} + \frac{b_1}{s^2 + (m_1 \omega)^2} + \ldots \frac{b_n}{s^2 + (m_n \omega)^2} \right) \quad (4)$$

With this representation, the current flowing through the capacitor is:

$$I_C = s C_0 V(s) \quad (5)$$

The current flowing through the primary inductor is:

$$I_0 = \frac{V(s)}{s L_0} \quad (6)$$

The current flowing through each branch resonator, for k = 1 ... n is:

$$I_k = \frac{1}{L_k} \left( \frac{s}{s^2 + \frac{1}{L_k C_k}} \right) V(s) \quad (7)$$

The challenge with the branch resonator equation is that oscillations due to the product of $L_k$ and $C_k$ can introduce new sinusoidal frequencies other than those specified by the voltage equation. The Moon et al. paper discussed above illustrates a mathematical method for establishing the necessary condition for the $L_k$ and $C_k$ values of each branch resonator to preclude such sine waves from occurring. The mathematical method of Moon et al. was expressly limited to the case of harmonically related sine waves for periodic waveforms. However, the method is also applicable to the more general case of non-periodic waveforms. The generalized mathematical requirement for each of the branch resonators is:

$$\frac{1}{\omega^2 + \frac{1}{L_0 C_0}} + \sum_{j=1}^{n} \frac{b_j m_j}{m_j^2 \omega^2 + \frac{1}{L_k C_k}} = 0. \quad (8)$$

For a system of n resonators, there will be n−1 roots to the above characteristic equation. Finding the individual values for $L_k$ and $C_k$ then follows the previously developed mathematical method based on Kirchoff's Current Law (KCL), as illustrated below:

$$\begin{bmatrix} \frac{1}{L_0} \\ \frac{1}{L_1} \\ \vdots \\ \frac{1}{L_{n-1}} \end{bmatrix} = \begin{bmatrix} 1 & \frac{1}{1-\alpha_1} & \cdots & \frac{1}{1-\alpha_{n-1}} \\ \frac{1}{m_1^2} & \frac{1}{m_1^2 - \alpha_1} & \cdots & \frac{1}{m_1^2 - \alpha_{n-1}} \\ \vdots & \vdots & \cdots & \vdots \\ \frac{1}{m_n^2} & \frac{1}{m_n^2 - \alpha_1} & \cdots & \frac{1}{m_n^2 - \alpha_{n-1}} \end{bmatrix}^{-1} \begin{bmatrix} C_0 \omega^2 \\ C_0 \omega^2 \\ \vdots \\ C_0 \omega^2 \end{bmatrix} \quad (9)$$

The process for finding the component values for the primary inductor and capacitors and inductors of the branch resonators can be summarized as follows:

1. Input waveform frequency ($\omega=2\pi F$) and target load capacitance ($C_0$).
2. Choose waveform frequency multipliers ($m_1, \ldots, m_n$) and their amplitudes ($b_1, \ldots, b_n$) to tailor waveform properties (e.g., edge rate and smoothness).
3. Find roots to characteristic equation using chosen multiplier and amplitude values.
4. Use roots of characteristic equation to build KCL matrix.
5. Invert KCL matrix to find inductance values for each branch resonator.
6. Use inductance values and roots of characteristic equation to find capacitance values for each branch resonator.

This procedure is illustrated for the case of a single branch resonator circuit for which there is only root to the characteristic equation (v):

$$v = \frac{m_1^2 + m_1 b_1}{1 + m_1 b_1} \quad (10)$$

The following relationships hold for the component values based on v:

$$\omega = 2\pi F \quad (11)$$

$$C_1 = \frac{(m_1^2 - v)(v-1)}{v^2} C_0$$

$$L_0 = \frac{v}{m_1 \omega^2 C_0}$$

$$L_1 = \frac{1}{v \omega^2 C_1}$$

The schematic of FIG. 8 illustrates component values for a circuit having a capacitive load of one farad and an output frequency of one radian per second. To scale the load capacitance 820 ($C_0$), the value of capacitor 840 ($C_1$) should be multiplied by the scaling factor and the values of inductors 810 ($L_0$) and 830 ($L_1$) should be divided by the scaling factor. To scale the frequency, the values of 810 ($L_0$) and 830 ($L_1$) should be divided by the square of the scaling factor.

Figure 9:
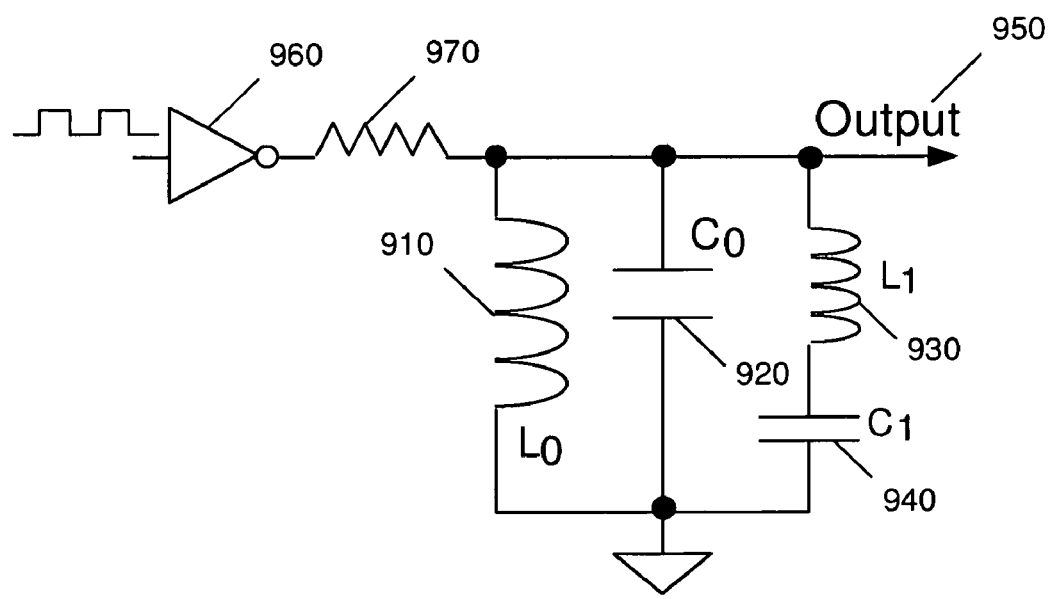
FIG. 9 illustrates a prior art circuit in which the circuit is powered from an amplifier.

In practice, resistive losses in the circuit require that energy be injected. FIG. 9 illustrates the circuit of FIG. 8 in which the circuit is powered from an amplifier. Primary inductor 910 ($L_0$) and capacitor 920 ($C_0$) are connected in parallel. Connected in parallel with these components is the series combination of inductor 930 ($L_1$) and capacitor 940 ($C_1$). Output 950 is measured across capacitor 920 ($C_0$). Amplifier 960 is coupled to output 950 through resistive element 970.

In practical applications the capacitor 920 ($C_0$) is the payload capacitance for the application, may be distributed across many elements, and is of crucial importance. The circuits of FIGS. 8 and 9 are therefore not readily usable for digital applications. One reason for this is that the signal on capacitor 920 ($C_0$) swings above and below the ground level. For digital applications, the signals must swing between ground and a positive voltage level.

Figure 10:
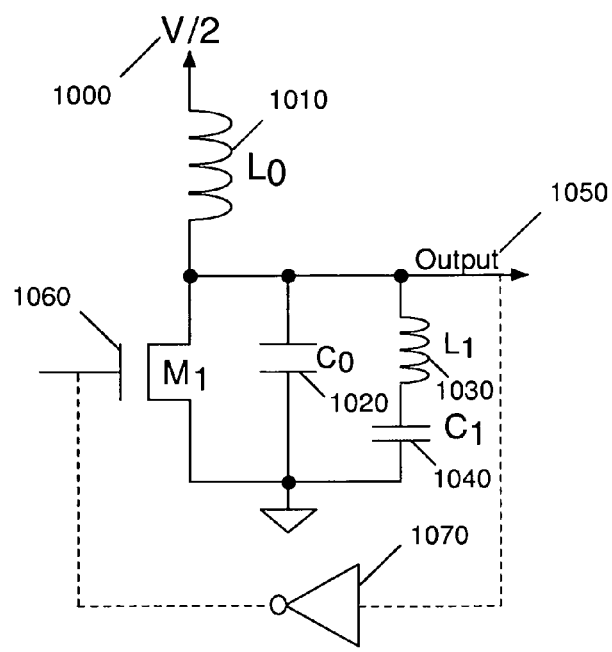
FIG. 10 illustrates one embodiment of the invention in which the n-channel MOSFET operates as a voltage-controlled resistor.

In an embodiment of the present invention, the grounded side of a primary inductor is coupled to a voltage source preferably at half the positive voltage level of the desired peak voltage. By changing the connections on the primary inductor, the voltage on the load capacitor will then swing between ground and the desired maximum voltage. A circuit illustrating an embodiment of the present invention is shown in FIG. 10. Primary inductor 1010 ($L_0$) is coupled between voltage source 1000 (V/2) and load capacitor 1020 ($C_0$). Connected in parallel with load capacitor 1020 ($C_0$) is the series combination of inductor 1030 ($L_1$) and capacitor 1040 ($C_1$). Output 1050 is measured across load capacitor 1020 ($C_0$). Note that capacitor 1020 ($C_0$) is the payload capacitor and while it is shown as an element within FIG. 10, in certain embodiments it may be distributed across multiple elements and may be external to the waveform generating circuitry.

In the circuit of FIG. 10, energy is injected at the end of each cycle using a single switch device. Switch 1060 ($M_1$), which can be an n-channel MOSFET transistor, is connected in parallel with load capacitor 1020 ($C_0$) for this purpose. Those of skill in the art will appreciated that in other environments another suitable device could be used. When the voltage across load capacitor 1020 ($C_0$) approaches zero volts, switch device 1060 ($M_1$) is turned on. Switch device 1060 ($M_1$) then provides a DC path from voltage source 1000 (V/2) to ground through inductor 1030 ($L_0$). The DC path re-energizes the circuitry through inductor 1030 ($L_0$) when switch device 1060 ($M_1$) is turned back on.

In an alternative embodiment, the circuit of FIG. 10 can be transformed into an oscillator by connecting output 1050 to the gate terminal of switch 1060 ($M_1$) device through inverting amplifier 1070 as shown. The phase delay of the signal from the input of switch 1060 ($M_1$) to output 1050 is 180 degrees. If the delay of inverting amplifier 1070 is chosen to match this delay, this will cause an additional phase shift of 180 degrees from output 1050 back to the input, causing the circuit of FIG. 10 to oscillate at the intended frequency.

Invariably there is a conduction loss through the switch device. For a MOSFET, this loss is proportional to the on resistance between the source and drain terminals. A larger device has a lower source to drain on-resistance but the energy required to operate the gate terminal of the MOSFET is also larger. It is universally true for any implementation of the switch device that to reduce the conduction loss requires a larger input energy to control the switch.

Figure 11:
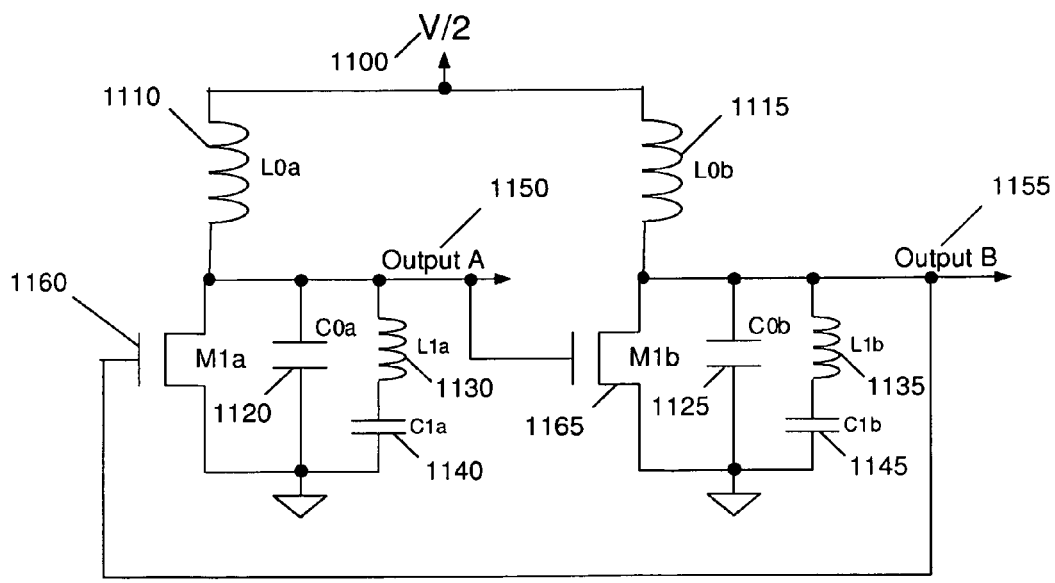
FIG. 11 illustrates an embodiment of the invention in which an oscillatory configuration is formed by cross-coupling the outputs and the gates.

A second embodiment of the present invention is shown in FIG. 11 in which two copies of the circuitry of FIG. 10 are interconnected by cross-coupling the outputs with the gate control nodes. Primary inductors 1110 ($L_{0a}$) and 1115 ($L_{0b}$) are coupled between voltage source 1100 (V/2) and load capacitors 1120 ($C_{0a}$) and 1125 ($C_{0b}$) respectively. Connected in parallel with load capacitors 1120 ($C_{0a}$) and 1125 ($C_{0b}$) are the series combinations of inductors 1130 ($L_{1a}$) and 1135 ($L_{1b}$) with capacitors 1140 ($C_{1a}$) and 1145 ($C_{1b}$) respectively. Switches 1160 ($M_{1a}$) and 1165 ($M_{1b}$) are connected in parallel with load capacitors 1120 ($C_{0a}$) and 1125 ($C_{0b}$) respectively. Output A 1150 is measured across load capacitor 1120 ($C_{0a}$) and Output B 1155 is measured across load capacitor 1125 ($C_{0b}$).

The cross coupling of the two stages illustrated in FIG. 11 is accomplished by coupling Output A 1150 to the gate terminal of switch 1165 ($M_{1b}$), and by coupling Output B 1155 to the gate terminal of switch 1160 ($M_{1a}$). With this configuration the gate capacitance of one output is lumped into the load capacitance of the other output for lower overall power dissipation.

The choice of two copies of the circuitry of FIG. 11 is for illustration purposes only; there could be any number of phases. U.S. patent application Ser. No. 10/344,168, published on Jul. 8, 2004 (Publication No. 20040130362), incorporated herein by reference, describes a multi-phase principle that can be applied to the present invention so that a plurality of overlapping and non-overlapping output phases can be generated. The sizing of the MOSFET can be derived from calculating the power loss per cycle and matching that loss to the power injected by $L_0$ when a DC circuit path is formed by $L_0$ and $M_1$.

For the embodiments of FIGS. 10 and 11 the sizing of the switch device (MOSFET) on resistance must be carefully chosen based on the other resistive losses in the system. If the resistive losses are too large then insufficient energy will be supplied through $L_0$ to balance out the energy dissipated due to the resistive losses. However, whenever the switch device is on, it will to some degree interfere with the intended waveform shape because the terminals of $C_0$ are shorted together by the switch device.

U.S. Pat. No. 5,559,478, incorporated herein by reference, illustrates how the shorting of an output capacitor can be used to create a new type of waveform. In particular, an embodiment is illustrated in which a switch device is turned on so that when the terminals of an output capacitor are shorted, the current flowing through a primary inductor increases approximately at the rate of $V_{dc}/L$. A phase angle $\theta$ is derived so that at $-\theta$ the voltage across the capacitor is zero and the voltage across the inductor is $V_{dc}$. At phase angle $\theta$, the voltage across the inductor is 0 and the voltage across the capacitor is $V_{dc}$. The switch is turned on at phase angle $-\theta$ and turned off at $\pi+\theta$. With this arrangement, the bottom of the waveform is substantially zero and flat while the switch device is on and the current reversed polarity in the inductor.

When the switch device is off, the voltage across the capacitor follows the trajectory of a sine wave starting at $-\theta$ and ending at $\pi+\theta$.

The condition for $V(\theta)$ is:

$$V_{dc}=V(\theta)=\sin\theta+b_1\sin m_1\theta \quad (12)$$

The condition for the current flowing through the inductor when the switch device is off is:

$$I(\theta) = \frac{1}{\omega L}\left(\cos\theta + \frac{b_1}{m_1}\cos m_1\theta\right) \quad (13)$$

The new fixed-point equation is:

$$\frac{V(\theta)}{I(\theta)} = \frac{2\omega L}{\pi + 2\theta} \rightarrow \frac{\cos\theta + \frac{b_1}{m_1}\cos m_1\theta}{\sin\theta + b_1\sin m_1\theta} = \frac{\pi}{2} + \theta \quad (14)$$

The solution to Equation 14 can be found by the Newton-Raphson method. Note that the value of $\theta$ depends on $b_1$. For the square-wave approximation ($b_1=\frac{1}{3}$), the value of $\theta$ is 0.296 radians. Alternatively, the waveform of FIG. 7 ($b_1=\frac{1}{7}$) has a $\theta$ value of 0.385 radians.

The formula above assumes an equal on versus off time for the switch device. Ratios other than 1:1 can be accommodated using the multi-phase principle as taught in U.S. patent application Ser. No. 10/344,168.

Referring to FIG. 10, note that when switch device 1060 ($M_1$) is on, the branch circuit of inductor 1030 ($L_1$) and capacitor 1040 ($C_1$) will oscillate freely. In particular, the branch circuit will oscillate at $\sqrt{v}$ times the intended frequency when the switch is on (as illustrated in Equation 11). The circuits illustrated in U.S. patent application Ser. No. 10/344,168 do not encounter this problem because there are no branch circuits.

Let $I_0(\theta)$ be the current through inductor 1010 ($L_0$) and $I_1(\theta)$ be the current through inductor 1030 ($L_1$). As with $I_0(\theta)$, the desired effect is to reverse the sign of $I_1(\theta)$ when the switch device is on. This reversal operation would be accomplished by the natural oscillation if the oscillation was stopped on a half-cycle boundary (an odd number of $\pi$ radians). An even number of half cycles maintains the sign of $I_0(\theta)$ while an odd number of half cycles reverses the sign of $I_1(\theta)$. However, the voltages across inductor 1030 ($L_1$) and capacitor 1040 ($C_1$) must be at the same level when the switch device is turned on and then later turned off. The implication is that the number of half-cycles must be even.

Both conditions for an odd and even number of half cycles cannot simultaneously be satisfied. The $I_1(\theta)$ branch current is small compared to $I_0(\theta)$ and by choice of $b_1$, $I_1$ can be minimized when the switch device turns on. However, there is additional energy in the branch circuit because of the potential across capacitor 1040 ($C_1$). This non-zero current and non-zero voltage will cause the branch circuit to oscillate while the switch device is on.

Figure 12:
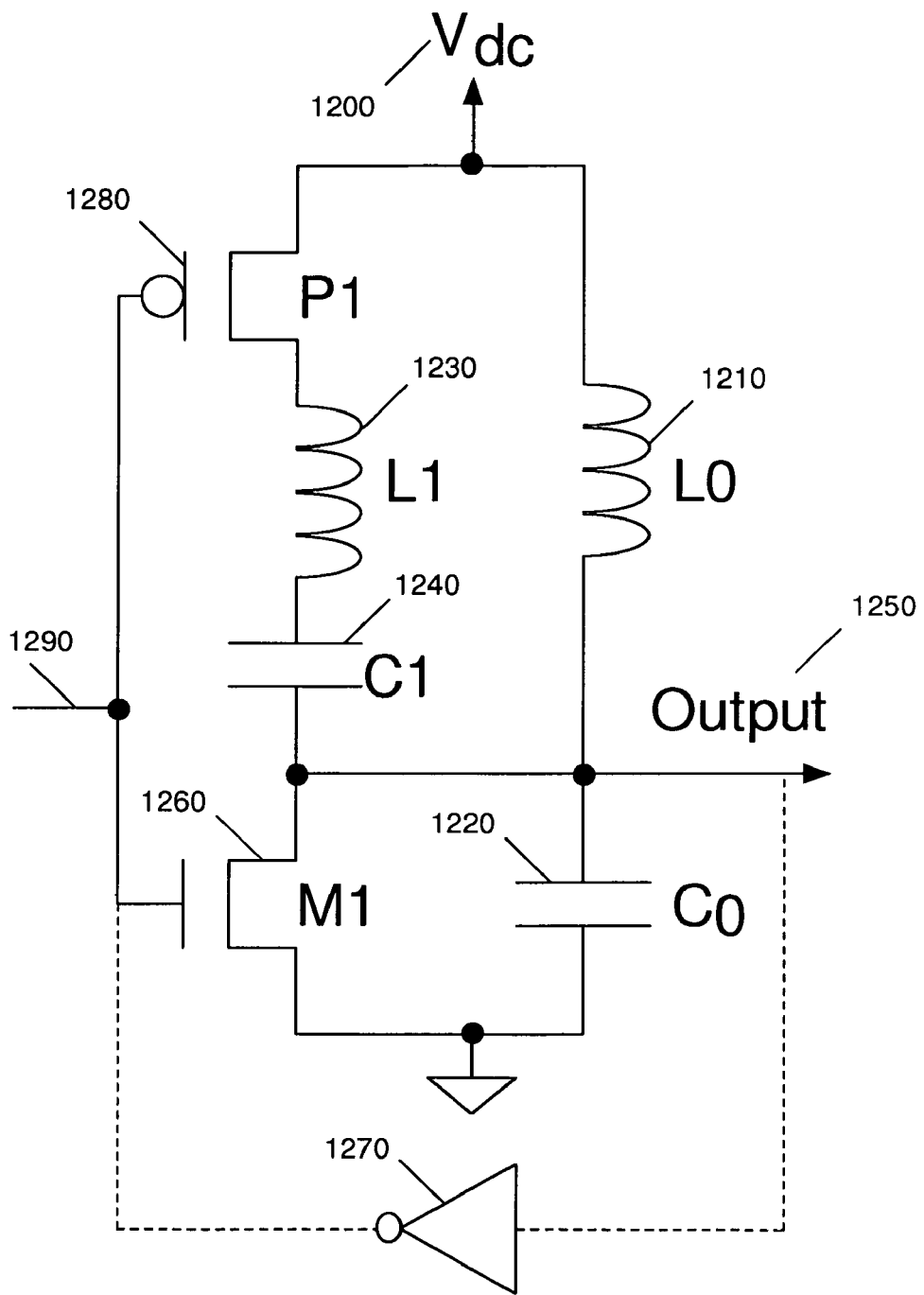
FIG. 12 illustrates an embodiment of the invention in which one n-channel MOSFET operates as a switch and one or more p-channel MOSFETs operate as branch-resonator suspenders.

Two changes to the circuit of FIG. 10 are introduced that solve this problem by suspending the branch-circuit oscillations when the switch devices are on. The two improvements are illustrated in the embodiment of FIG. 12. First, the branch circuit is moved from across the output capacitor to across the primary inductor. Second, a switch device that is normally on is connected in series with the branch circuit. Primary inductor 1210 ($L_0$) is coupled between voltage source 1200 ($V_{dc}$) and load capacitor 1220 ($C_0$). Connected in parallel with inductor 1210 ($L_0$) is the series combination of switch 1280 ($P_1$), inductor 1230 ($L_1$) and capacitor 1240 ($C_1$). Switch 1260 ($M_1$) is connected in parallel with load capacitor 1220 ($C_0$). Output 1250 is measured across load capacitor 1220 ($C_0$). Note that capacitor 1220 ($C_0$) is the payload capacitor and while it is shown as an element within FIG. 12, in certain embodiments it may be distributed across multiple elements and may be external to the waveform generating circuitry.

In the circuit illustrated in FIG. 12, the current through inductor 1230 ($L_1$) is close to zero or zero at $-\theta$ and $\pi+\theta$ while the potential across capacitor 1240 (CO is also zero or close to zero. In the embodiment of FIG. 12 the gate control nodes for switch devices 1260 ($M_1$) and 1280 ($P_1$) are connected together (1290). In other embodiments the gate control nodes may be connected to separate inputs. That is, it would be possible to generate two different control signals, one coupled to the gate of switch device 1260 ($M_1$) and one coupled to the gate of switch device 1280 ($P_1$).

The rising of the voltage on the gate terminals of switch devices 1260 ($M_1$) and 1280 ($P_1$) will turn on switch device 1260 ($M_1$) and will turn off switch device 1280 ($P_1$). In one embodiment, switch device 1280 ($P_1$) is a p-channel MOSFET. When switch device 1280 ($P_1$) turns off, the oscillation in inductor 1230 ($L_1$) and capacitor 1240 ($C_1$) is suspended with the voltage between inductor 1230 ($L_1$) and capacitor 1240 ($C_1$) at close to zero. Thus, the voltage on output capacitor 1220 ($C_0$) will not change. A falling voltage on the gate terminals of the two switch devices will turn switch device 1260 ($M_1$) off and 1280 ($P_1$) on, allowing the oscillations to continue as before. Output 1250 may be connected to the gate terminal of switch 1260 ($M_1$) through inverting amplifier 1270 as shown.

As with the circuit of FIG. 10, the phase delay from the gate terminals of switch devices 1260 ($M_1$) and 1280 ($P_1$) to output 1250 is 180 degrees. If an additional phase shift of 180 degrees is introduced from output 1250 to the gate terminals of switch devices 1260 ($M_1$) and 1280 ($P_1$), the circuit of FIG. 12 will oscillate at the intended frequency. In one embodiment the phase shift is introduced by an inverting amplifier.

Figure 13:
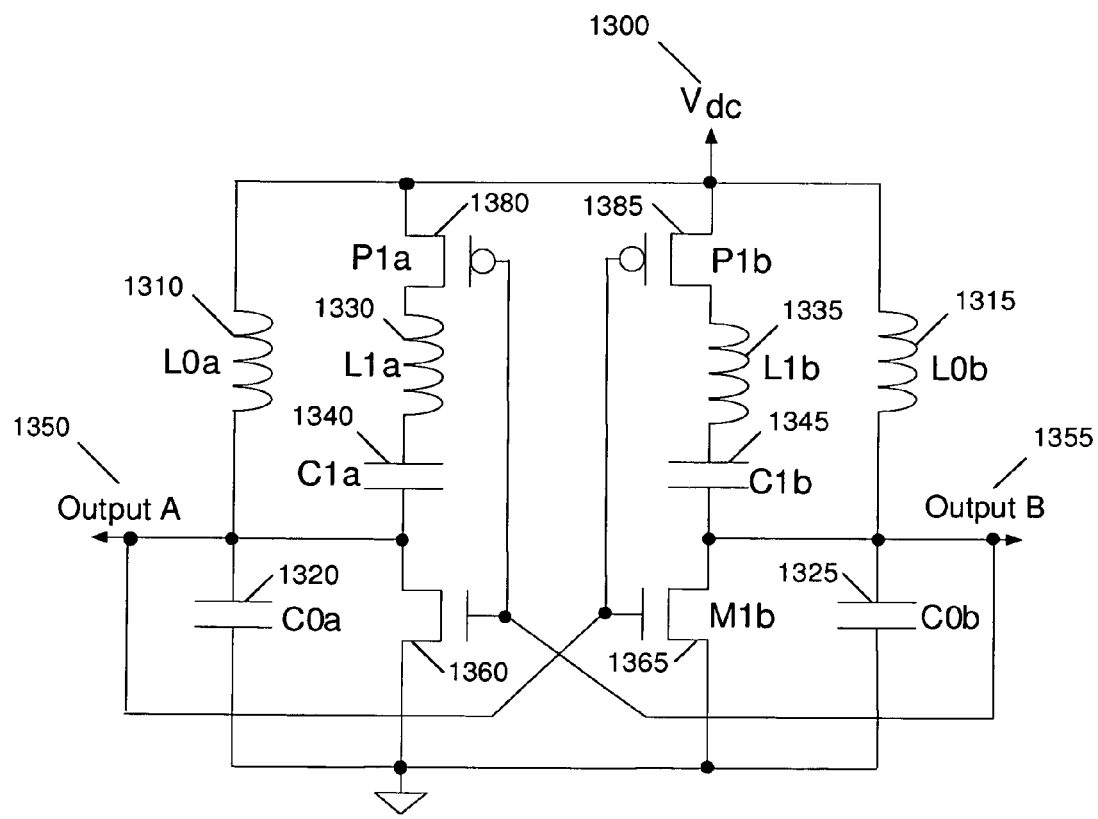
FIG. 13 illustrates an embodiment of the invention in which an oscillatory configuration is formed by cross-coupling the outputs and the gates.

FIG. 13 shows an embodiment in which two copies of the circuitry of FIG. 12 are interconnected by cross-coupling the outputs with the gate control nodes. Primary inductors 1310 ($L_{0a}$) and 1315 ($L_{0b}$) are coupled between voltage source 1300 ($V_{dc}$) and load capacitors 1320 ($C_{0a}$) and 1325 ($C_{0b}$) respectively. Connected in parallel with primary inductors 1310 ($L_{0a}$) and 1315 ($L_{0b}$) are the series combinations of switches 1380 ($P_{1a}$) and 1385 ($P_{1b}$), inductors 1330 ($L_{1a}$) and 1335 ($L_{1b}$) with capacitors 1340 ($C_{1a}$) and 1345 ($C_{1b}$) respectively. Switches 1360 ($M_{1a}$) and 1365 ($M_{1b}$) are connected in parallel with load capacitors 1320 ($C_{0a}$) and 1325 ($C_{0b}$) respectively. Output A 1350 is measured across load capacitor 1320 ($C_{0a}$) and Output B 1355 is measured across load capacitor 1325 ($C_{0b}$). Output A 1350 is coupled to the gate terminals of switches 1365 ($M_{1b}$) and 1385 ($P_{1b}$), and Output B 1355 is coupled to the gate terminals of switches 1360 ($M_{1a}$) and 1380 ($P_{1a}$).

Figure 14:
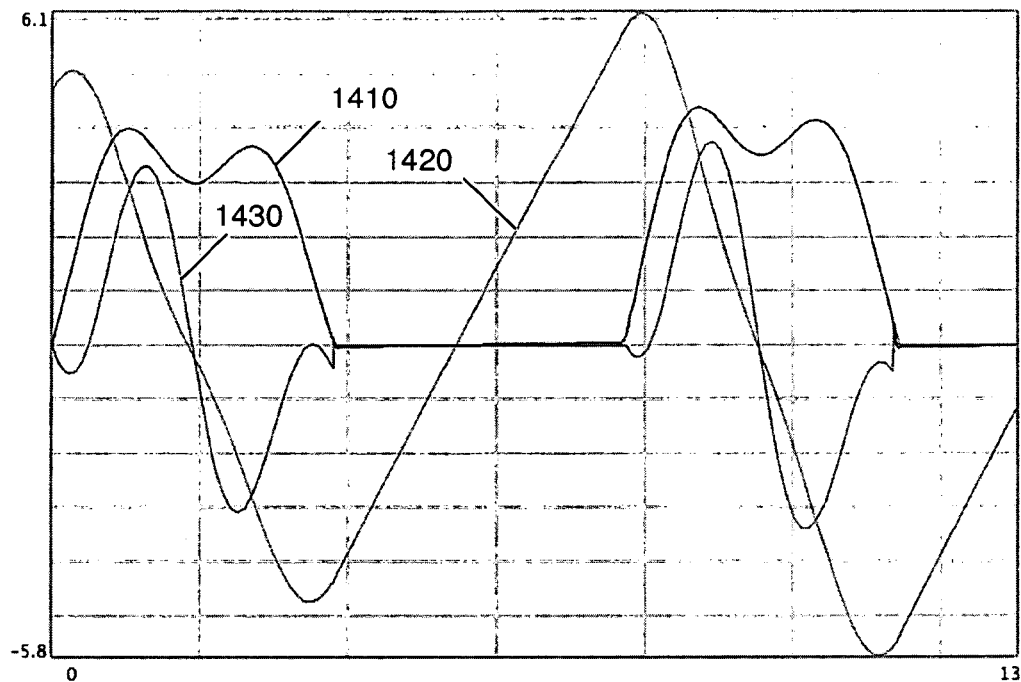
FIG. 14 illustrates a plot of current waveforms for the embodiment of the invention illustrated in FIG. 13.
Figure 15:
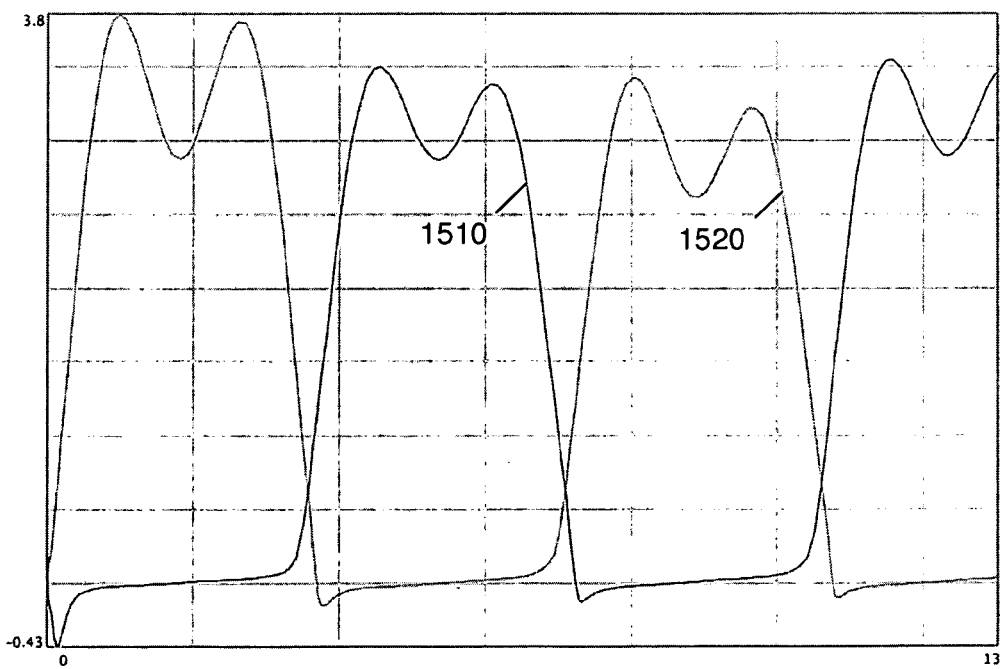
FIG. 15 illustrates a plot of output voltage waveforms for the embodiment of the invention illustrated in FIG. 13.

FIG. 14 illustrates time-domain plots for voltage and current waveforms associated with the circuitry illustrated in FIG. 12. Waveform 1410 is the curve for the voltage at Output 1250. Waveform 1420 is the curve for the current through primary inductor 1210. Waveform 1430 is the curve for the current through branch inductor 1230. FIG. 15 illustrates time domain plots for the voltage outputs associated with the circuitry illustrated in FIG. 13. Waveform 1510 is the curve for the voltage at one output (e.g. output A 1350) and waveform 1520 is the curve for the voltage at the other output (e.g. output B 1355).

As mentioned earlier, higher-order harmonic oscillators can be built using multiple branch circuits. In this case, the branch circuits are connected and staged in the same fashion as described above. For example, a fifth-order (three-stage) circuit corresponding to the embodiment illustrated in FIG. 12 would have an additional inductor, capacitor and switch connected in parallel to inductor 1230 ($L_1$), capacitor 1240 ($C_1$) and switch 1280 ($P_1$).

Figure 16:
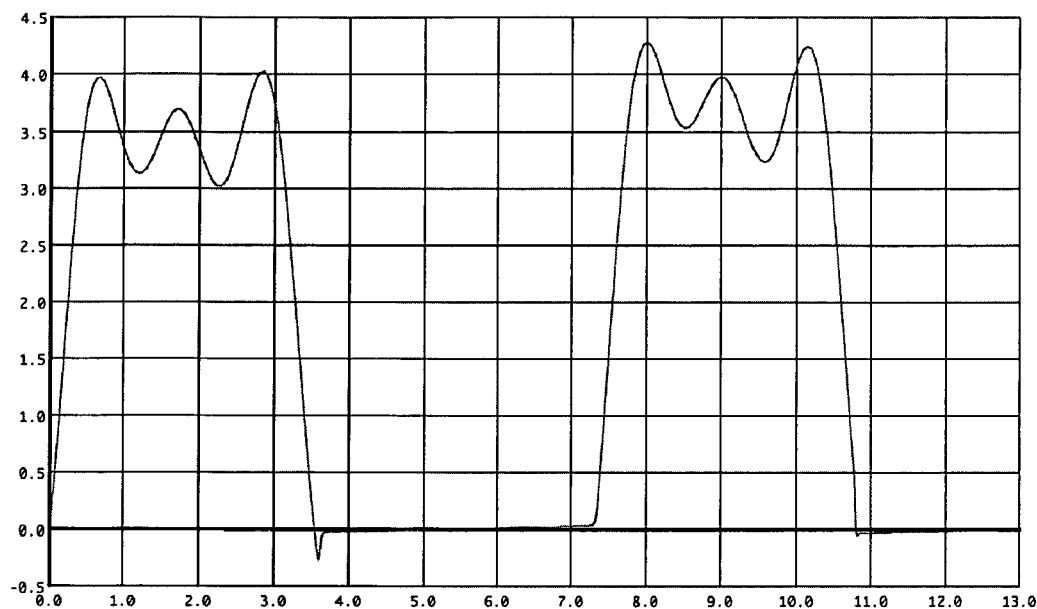
FIG. 16 illustrates square wave approximation waveforms for a fifth order harmonic resonator.
Figure 17:
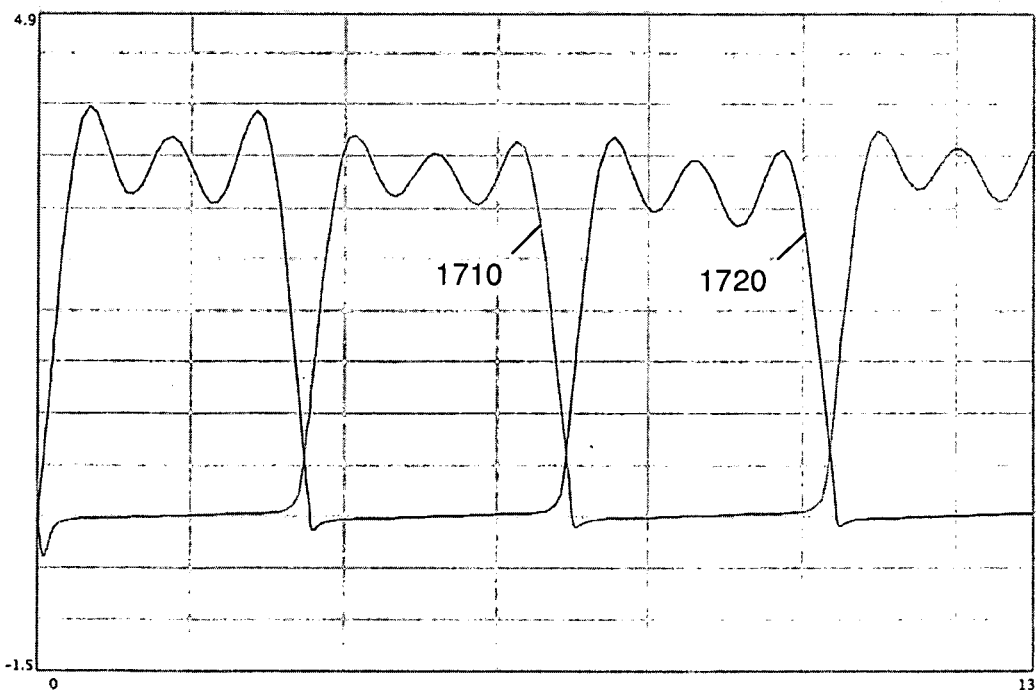
FIG. 17 illustrates square wave approximation waveforms for a fifth order harmonic resonator.

FIG. 16 illustrates a time domain plot for the voltage output associated with a three-stage circuit of the type illustrated in FIG. 12. FIG. 17 illustrates time domain plots for the voltage outputs associated with a three-stage circuit of the type illustrated in FIG. 13. Waveforms 1710 and 1720 are the two complementary output waveforms.

Referring to FIG. 12, a source of inefficiency with respect to power loss is that switch devices 1260 ($M_1$) and 1280 ($P_1$) turn on and off at times when there is residual current in inductor 1230 ($L_1$) and a non-zero voltage across capacitor 1240 ($C_1$). The effect of turning off switch device 1280 ($P_1$) when the current through inductor 1230 ($L_1$) is not at zero can be seen in FIG. 14. One improvement would be to drive the gate control nodes for switch devices 1260 ($M_1$) and 1280 ($P_1$) from separate controlling signals to suspend the branch-resonator oscillations at just the point when the current and/or voltage reach zero.

The inefficiency can be minimized by configuring the branch circuit to resonate at a non-integral multiple of the fundamental frequency. This means that the two frequencies are no longer harmonically related. This technique will not work for embodiments of the type illustrated in FIGS. 10 and 11 since the oscillations will decompose as the currents and voltages drift out of phase from cycle to cycle. However, for the case of the embodiments of the type illustrated in FIGS. 12 and 13, switch devices 1280 ($P_1$), 1380 ($P_{1a}$) and 1385 ($P_{1b}$) effectively resets or restores the correct current relationships after each cycle.

In the case of branch circuits with non-integral harmonic frequencies, the symmetrical voltage swing about $V_{dc}$ no longer holds nor does the symmetry of the stopping and stopping of the current through the primary inductor around the zero current level. The fixed-point calculation for $\theta$ now requires that the end-point conditions to be explicitly considered, as shown below:

$$\frac{V(-\theta) - V(\theta + \pi)}{I_0(-\theta) - I_0(\theta + \pi)} = \frac{2\omega L_0}{\pi + 2\theta} \qquad (15)$$

Figure 18:
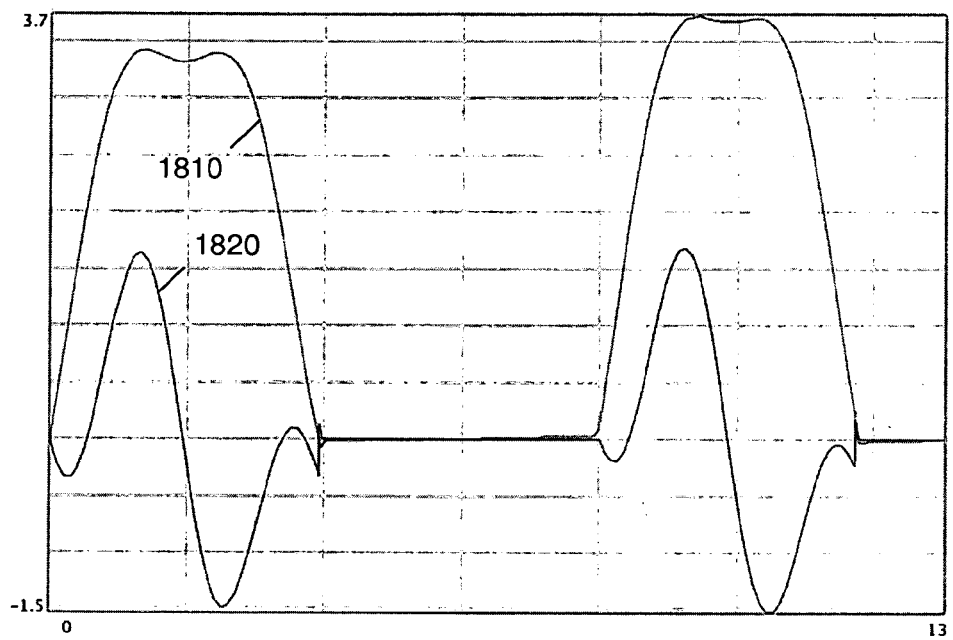
FIG. 18 illustrates an improved waveform with minimized power loss in the branch circuit.

FIG. 18 shows time domain plots associated with an improved design with minimized power loss in the branch circuit for a two-stage circuit such as that illustrated in FIG. 12. Waveform 1810 is the curve for the output voltage and waveform 1820 is the curve for the current through the branch circuit. In the example illustrated in FIG. 18, the frequency of the second sine wave is 2.91 times that of the first with an amplitude of one-seventh that of the first or fundamental.

The technique readily extends to embodiments with more than one branch resonator. The circuit representation is the same with the difference being the inter-relationship of the sine wave frequencies and the component-value selection.

Figure 19:
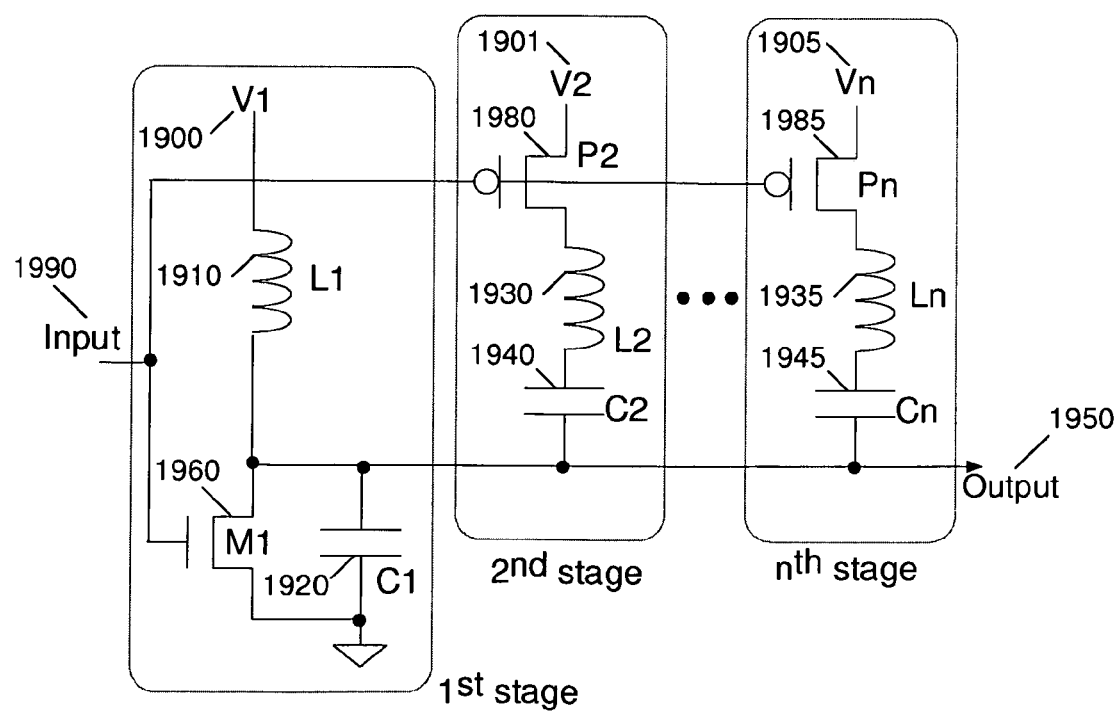
FIG. 19 illustrates how the embodiment of FIG. 12 can be cascaded to include more than one branch resonator.

FIG. 19 illustrates an n-stage embodiment in which three or more stages are utilized. Primary inductor 1910 ($L_1$) is coupled between voltage source 1900 ($V_1$) and load capacitor 1920 ($C_1$). The second stage branch resonator consists of the series combination of switch 1980 ($P_2$), inductor 1930 ($L_2$) and capacitor 1940 ($C_2$) coupled between voltage source

1901 ($V_2$) and output 1950. The n-th stage branch resonator consists of the series combination of switch 1985 ($P_n$), inductor 1935 ($L_n$) and capacitor 1945 ($C_n$) coupled between voltage source 1905 ($V_n$) and output 1950. Switch 1960 ($M_1$) is connected in parallel with load capacitor 1920 ($C_1$). Control input 1990 is coupled to the gate terminals of switches 1960 ($M_1$), 1980 ($P_2$) and 1985 ($P_n$). Output 1950 is measured across load capacitor 1920 ($C_1$). The complementary version for the n-stage embodiment has the same mirroring and interconnection as the two-stage embodiment of FIG. 13.

A further improvement illustrated in FIG. 19 is that each branch resonator is powered from a separate voltage source. Voltage source 1900 ($V_1$) is coupled to primary inductor 1910 ($L_1$), voltage source 1901 ($V_2$) is coupled to the second stage branch resonator and voltage source 1905 ($V_n$) is coupled to the n-th stage branch resonator. The ability to adjust the voltage on a per stage basis can be used to further tune the voltage and current waveforms to minimize non-zero currents and voltage drops when the switches turn on or off at the expense of added complexity in the source power generation.

Figure 20:
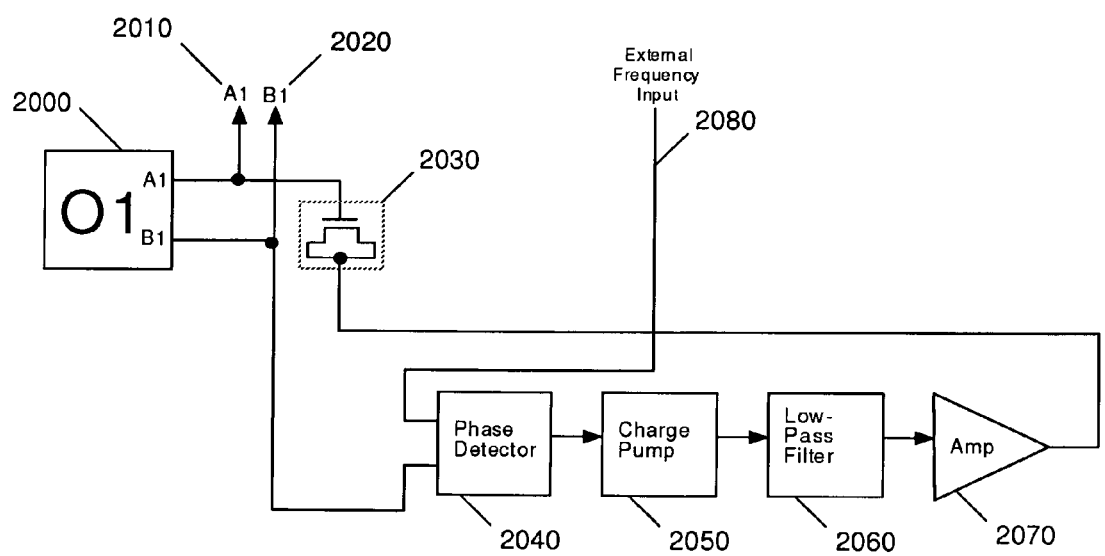
FIG. 20 illustrates an embodiment of the invention applied to a phase-locked timing generator.

FIG. 20 illustrates an embodiment of the present invention applied to a phase-locked timing generator in which a varactor is used. Oscillator 2000 (O1) represents one of the mutual-oscillator configurations discussed above, such as is illustrated in FIGS. 11 and 13, with outputs 2010 (A1) and 2020 (B1). Output 2020 (B1) is coupled to one input of phase detector 2040. The other input of phase detector 2040 is coupled to external frequency input 2080. The output of phase detector 2040 is coupled to charge pump 2050 which is coupled to low-pass filter 2060 which is coupled to amplifier 2070. The phase difference between the external frequency input and output 2020 (B1) of oscillator 2000 (O1) is converted to a voltage through phase detector 2040, charge pump 2050, low-pass filter 2060, and amplifier 2070.

The output of amplifier 2070 is coupled to varactor 2030. In this timing-generator embodiment varactor 2070 is a MOSFET for which the source and drain are tied together. Varactor 2070 could also be implemented as a MOS capacitor. The other side of varactor 2070 is coupled to output 2010 (A1) of oscillator 2000 (O1). In this configuration, varactor 2070 implements a capacitor that varies with the voltage across it. In particular, the capacitance at the gate node of the MOSFET varies with the voltage applied to the source and drain nodes. In this way, by augmenting the output capacitance seen by output 2010 (A1) of oscillator 2000 (O1), frequency and phase is adjusted based on the output of amplifier 2070. Note that varactor 2030 could be connected to either or both of the outputs of oscillator 2000 (O1). It is appreciated by those of skill in the art that a variety of other suitable device could be used.

The circuitry illustrated in FIG. 20 illustrates how an oscillator configuration of the present invention can be used as a voltage-controlled oscillator (VCO) for a phase-locked loop. The change in voltage output by amplifier 2070 either increases or decreases the frequency output of oscillator 2000 (O1). This completes the feedback loop in which the system stabilizes when the oscillator is locked in frequency and phase to the external frequency input.

Figure 21:
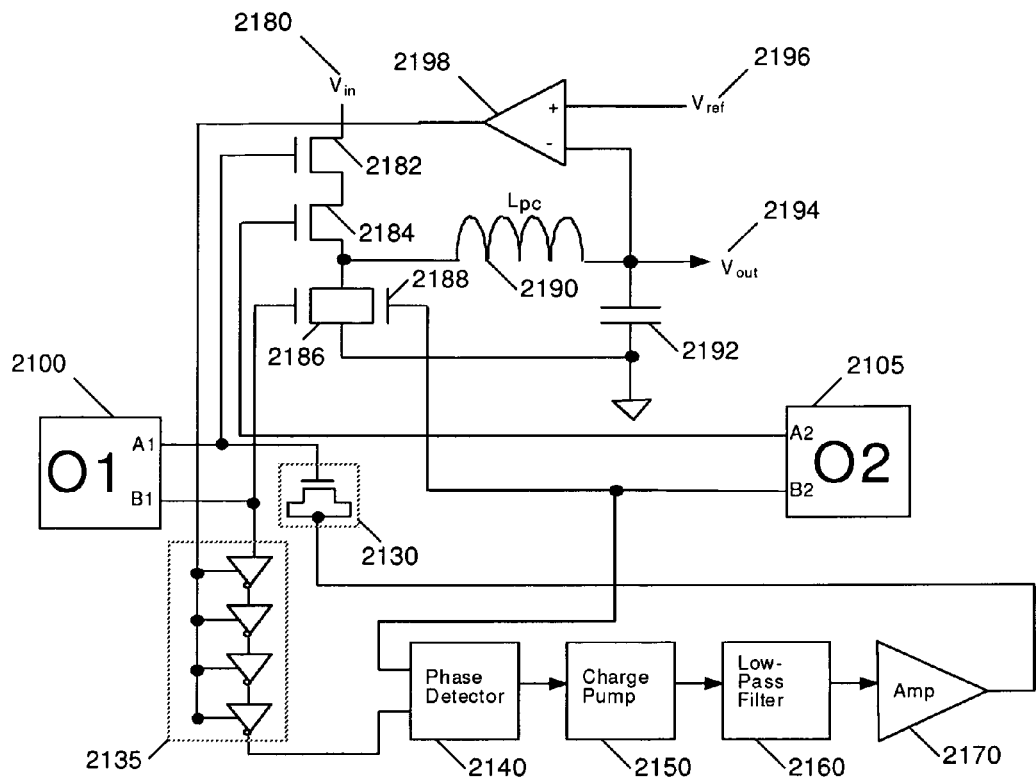
FIG. 21 illustrates an embodiment of the present invention applied to switching power-supply.

FIG. 21 illustrates an embodiment of the present invention applied to a switching power-supply in which two complementary oscillator configurations are used. Oscillators 2100 (O1) and 2105 (O2) represent two instances of the oscillator configurations discussed above, with outputs A1, B1 and A2, B2 respectively. The outputs of oscillators 2100 (O1) and 2105 (O2) are coupled to the control gates of power MOSFETs 2182, 2184, 2186 and 2188. These power MOSFETs are connected to the input side of power coil 2190 ($L_{pc}$).

When both A1 and A2 are high, power MOSFETs 2182 and 2184 are both enabled and input voltage 2180 ($V_{in}$) is coupled to the input side of power coil 2190 ($L_{pc}$). Similarly, if either B1 or B2 are high, one or both of power MOSFETs 2186 and 2188 are enabled, and the input side of power coil 2190 ($L_{pc}$) is coupled to ground.

The output side of power coil 2190 ($L_{pc}$) is coupled to output 2194 ($V_{out}$) and output capacitor 2192 is coupled between output 2194 ($V_{out}$) and ground. In order to control output 2194 ($V_{out}$), the difference between the voltage at output 2194 ($V_{out}$) and input reference voltage 2196 ($V_{ref}$) is amplified by amplifier 2198 and used to adjust the delay between the two frequency-locked oscillators 2100 (O1) and 2105 (O2) through voltage-controlled delay line 2135. The two oscillators remain frequency locked through phase detector 2140, charge pump 2150, low-pass filter 2160, amplifier 2170 and varactor 2130 in a configuration similar to that discussed above with respect to FIG. 20.

In this switching-power supply embodiment, voltage-controlled delay line 2135 is implemented as a series connection of four inverting amplifiers. The delay of each amplifier stage is controlled by the supply voltage of the amplifier. It is appreciated by those of skill in the art that in other environments another suitable circuit could be used in place of voltage-controlled delay line 2135. For example, one or more varactors may be used on the outputs of the amplifiers to adjust delay as a function of voltage With zero or 360 degrees of phase delay between oscillators 2100 (O1) and 2105 (O2), the outputs of the two oscillators will be identical and perfectly overlap. In this case, power coil 2190 (Lpc) connects to voltage input 2180 (Vin) at a 50% duty cycle for maximum current transfer. Conversely, when the phase delay between oscillators 2100 (O1) and 2105 (O2) is 180 degrees, the outputs of the two oscillators will be mutually exclusive and voltage input 2180 (Vin) will not connect to power coil 2190 (Lpc). In this case all current is drawn to the output from the ground connection. Adjusting the phase delay through voltage-controlled delay line 2135 to an intermediate point between 180 degrees and 360 degrees in turn adjusts the duty cycle to an intermediate point from 0% to 50%. Thus, controlling voltage-controlled delay line 2135 with the output of error amplifier 2198 will regulate output 2194 to the reference voltage level 2196 based on the current load on the output of power coil 2190.

Several embodiments of the present invention have been described wherein switch devices are implemented as MOSFETs. Those of skill in the art will appreciate that there are many alternative implementations of the switch devices. In some embodiments, the switch devices, inductive elements and capacitive elements are all implemented on a silicon-based integrated circuit. Alternatively, embodiments of the present invention may be constructed using discrete components, or may be implemented using a combination of discrete components with integrated circuitry. In some cases, it may be desirable to configure the characteristics of the switching devices, inductive elements, and/or capacitive elements during the manufacturing process of an integrated circuit. Alternatively, device characteristics may be selected or configured after manufacturing.

The foregoing descriptions of the embodiments of the present invention have been presented for purposes of illustration and description only. They are not intended to be exhaustive or to limit the present invention to the forms disclosed. Accordingly, many modifications and variations will be apparent to practitioners skilled in the art. The scope of present invention is defined by the appended claims.

The invention claimed is:

1. A resonant waveform generating circuit comprising:
    a first stage including:
        a first inductive element coupled between a first voltage source and a first node;
        a first switching device coupled between said first node and a second node, said first switching device being responsive to a first control signal;
    a second stage including:
        a first branch resonator circuit in series with a second switching device coupled between said first node and a second voltage source, said second switching device being responsive to a second control signal;
    wherein an output voltage at said first node swings between the voltage at said second node and a predetermined maximum voltage; and
    wherein when said first switching device is off and said second switching device is on, the signal at said first node consists of a superposition of a plurality of sine waves.

2. The circuit of claim 1 further comprising:
    a third stage including:
        a second branch resonator circuit in series with a third switching device coupled between a said first node and a third voltage source, said third switching device being responsive to said second control signal.

3. The circuit of claim 1 wherein said first control signal and said second control signal are coupled together.

4. The circuit of claim 1 wherein said first voltage source and said second voltage source are coupled together.

5. The circuit of claim 1, wherein said first voltage source and said second voltage source have voltage levels less than said predetermined maximum voltage.

6. The circuit of claim 1, wherein said first control signal and said second control signal are coupled to an external signal source.

7. The circuit of claim 1, wherein the signal at said first node is used for sequencing and synchronizing one or more digital circuits.

8. The circuit of claim 1, wherein the signal at said first node is used to generate a timing waveform for powering or controlling one or more digital circuits.

9. A method of generating an output waveform comprising the steps of:
    controlling a first switching device coupled between a first node and a second node to be off during a first phase wherein a first inductive element is coupled between a first voltage source and said first node source and a first branch resonator circuit in series with a second switching device is coupled between a second voltage source and said first node;
    controlling said second switching device to be on during said first phase;
    controlling said first switching device to be on during a second phase; and
    controlling said second switching device to be off during said second phase;
    wherein the voltage between said first node and said second node swings between zero and a predetermined maximum value; and
    wherein during said first phase, the signal at said first node consists of a superposition of a plurality of sine waves.

10. The method of claim 9, further comprising the steps of:
    controlling a third switching device to be on during said first phase wherein a second branch resonator circuit in series with said third switching device is coupled between a third voltage source and said first node; and
    controlling said third switching device to be off during said second phase.

11. The method of claim 9, wherein said first voltage source and said second voltage source are coupled together.

12. The method of claim 9, wherein said first voltage source and said second voltage source have voltage levels less than said predetermined maximum voltage.

13. The method of claim 9, wherein the signal at said first node is used for sequencing and synchronizing one or more digital circuits.

14. The method of claim 9, wherein the signal at said first node is used to generate a timing waveform for powering or controlling one or more digital circuits.

* * * * *